(12) United States Patent
Li

(10) Patent No.: US 10,345,935 B2
(45) Date of Patent: Jul. 9, 2019

(54) FLEXIBLE TOUCH-SENSITIVE DISPLAY AND ELECTRONIC DEVICE HAVING NANO TECHNOLOGY TOUCH ELECTRODES

(71) Applicant: Wuhan China Star Optoelectronics Technology Co., Ltd., Wuhan, Hubei (CN)

(72) Inventor: Bo Li, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 208 days.

(21) Appl. No.: 15/328,423

(22) PCT Filed: Dec. 26, 2016

(86) PCT No.: PCT/CN2016/112145
§ 371 (c)(1),
(2) Date: Jan. 23, 2017

(87) PCT Pub. No.: WO2018/112989
PCT Pub. Date: Jun. 28, 2018

(65) Prior Publication Data
US 2018/0292925 A1 Oct. 11, 2018

(30) Foreign Application Priority Data
Dec. 22, 2016 (CN) .......................... 2016 1 1196678

(51) Int. Cl.
*G06F 3/041* (2006.01)
*G06F 3/044* (2006.01)
(Continued)

(52) U.S. Cl.
CPC ............ *G06F 3/041* (2013.01); *G06F 1/1652* (2013.01); *G06F 3/044* (2013.01);
(Continued)

(58) Field of Classification Search
CPC .......... G06F 3/041; G06F 3/044; G06F 3/045; G06F 3/046; G06F 3/047; G06F 3/0412;
(Continued)

(56) References Cited

U.S. PATENT DOCUMENTS

| 2012/0075209 A1* | 3/2012 | Lee ......................... G06F 3/044 345/173 |
| 2014/0218630 A1 | 8/2014 | Kang |

(Continued)

FOREIGN PATENT DOCUMENTS

| CN | 104423691 A | 3/2015 |
| CN | 105630230 A | 6/2016 |

(Continued)

*Primary Examiner* — Darlene M Ritchie
(74) *Attorney, Agent, or Firm* — Andrew C. Cheng

(57) ABSTRACT

The present disclosure provides a touch-sensitive display and electronic device having the touch-sensitive display. The touch display includes: a flexible substrate having opposing first and second surfaces; a blocking layer arranged on the first surface and at side end of the first surface; an insulating layer arranged on the first surface and the blocking layer; a touch electrode thin film layer arranged on the insulating layer; a first wiring layer arranged on the touch electrode thin film layer and located at side end of the touch electrode thin film layer; an adhesive layer arranged on the touch electrode film layer and the first wiring layer; and a display screen, the display surface of the display screen is adhered on the adhesive layer. The touch display of the present disclosure uses a thin film to realize the touch function so as to have a thinner thickness and to realize free bending.

11 Claims, 3 Drawing Sheets

(51) Int. Cl.
*G06F 1/16* (2006.01)
*H01L 51/00* (2006.01)

(52) U.S. Cl.
CPC .............. *G06F 2203/04102* (2013.01); *G09G 2380/02* (2013.01); *H01L 51/0097* (2013.01); *H01L 2251/5338* (2013.01)

(58) Field of Classification Search
CPC ......... G06F 2203/04102; G02F 1/1652; H01L 21/02603; H01L 29/0669; H01L 51/0097; H01L 2251/5338; G09G 2380/02
See application file for complete search history.

(56) References Cited

U.S. PATENT DOCUMENTS

| | | | | |
|---|---|---|---|---|
| 2015/0253901 | A1* | 9/2015 | Chan | G06F 3/044 427/555 |
| 2015/0293629 | A1* | 10/2015 | Ryu | G06F 3/044 345/174 |
| 2016/0179229 | A1* | 6/2016 | Ahn | G06F 3/041 345/173 |
| 2018/0074553 | A1* | 3/2018 | Yamazaki | G09F 9/00 |
| 2018/0150170 | A1* | 5/2018 | Oh | H01L 51/003 |
| 2018/0212167 | A1* | 7/2018 | Chun | H01L 51/52 |

FOREIGN PATENT DOCUMENTS

| | | |
|---|---|---|
| CN | 205388744 U | 7/2016 |
| CN | 205405467 U | 7/2016 |
| CN | 106155400 A | 11/2016 |

* cited by examiner

FLEXIBLE TOUCH-SENSITIVE DISPLAY AND ELECTRONIC DEVICE HAVING NANO TECHNOLOGY TOUCH ELECTRODES

FIELD OF THE DISCLOSURE

The present disclosure relates to a touch display technology field, and more particularly to a method for manufacturing display panel, and more particularly to a touch-sensitive display which is light and thin and is capable of bending freely and an electronic device having the touch-sensitive display.

BACKGROUND OF THE DISCLOSURE

The touch screen is an input device that allows the user using a finger or an object by selecting the instruction content displayed on the screen of the image display or the like to input the user's instruction. The user's hand or object is in direct contact with the touch screen at the contact location. Since such the touch screen can replace the independent input device such as the keyboard or the mouse connected to the image display, the application field thereof has been widening.

Flexible touch screen is a new concept, and, at present, there is no fully flexible touch screen on the market. There are more touch panels cannot be bent freely because of having touch electrodes attached onto a glass cover with a certain degree.

SUMMARY OF THE DISCLOSURE

In order to solve the above-mentioned conventional technical problems, it is an object of the present disclosure to provide a touch display device that is light and thin and is free to bend, and an electronic device including the touch display device.

According to an aspect of the present disclosure, there is provided a touch-sensitive display including: a flexible substrate having opposing first and second surfaces; a blocking layer arranged on the first surface and at a side end of the first surface; an insulating layer arranged on the first surface and the blocking layer; a touch electrode thin film layer arranged on the insulating layer; a first wiring layer arranged on the touch electrode thin film layer and located at a side end of the touch electrode thin film layer; an adhesive layer arranged on the touch electrode film layer and the first wiring layer; and a display screen, the display surface of the display screen is adhered on the adhesive layer.

Optionally, the touch display further includes: a hard protective layer arranged on the second surface.

Optionally, the touch electrode thin film layer includes: a plurality of first sensing strings extending in a row direction and the plurality of first sensing strings parallel to and separate from each other, each first sensing string including a plurality of first sensing pads in series and a plurality of first bridge lines, each first bridge line disposed between two adjacent first sensing pads and connecting the two adjacent first sensing pads in series with each other; a plurality of second sensing strings extending in a column direction and the plurality of second sensing strings parallel to and separate from each other, each second sensing string including a plurality of second sensing pads in series and a plurality of second bridge lines, each second bridge line disposed between two adjacent first sensing pads and connecting the two adjacent second sensing pads in series with each other; the first sensing pad and the second sensing pad are located in the same layer, the first and second bridge wires are insulated from each other.

Optionally, the first sensing string and/or the second sensing string are selected from one of carbon nanotubes, nanosilver lines and nano-silver particles.

Optionally, the touch electrode thin film layer includes: a first sensing layer arranged on the insulating layer, the first sensing layer includes a plurality of first sensing strips, the first sensing strip extends in a row direction and the plurality of first sensing strips are parallel to each other and separated from each other; a second wiring layer arranged on the first sensing layer and at a side end of the first sensing layer; an insulation spacer layer arranged on the first sensing layer and the second wiring layer; a second sensing layer arranged on the insulation spacer layer, the second sensing layer includes a plurality of second sensing strips, the second sensing strip extends in a column direction and the plurality of second sensing strips are parallel to each other and separated from each other; wherein, the first wiring layer is provided on the second sensing layer and is located at a side end of the second sensing layer, the adhesive layer is arranged between the second sensing layer and the first wiring layer.

Optionally, the first sensing strip and/or the second sensing strip is selected from one of carbon nanotubes, nanosilver lines and nano-silver particles, and the second wiring layer is made of silver.

Optionally, the display is an organic electroluminescent display.

Optionally, the adhesive layer is made of optical glue.

Optionally, the first wiring layer is made of silver.

According to another aspect of the present disclosure, there is also provided an electronic device including the above-described touch-sensitive display.

Advantageous effects of the present disclosure: the touch display of the present disclosure uses a thin film to realize the touch function so as to have a thinner thickness and to realize free bending.

BRIEF DESCRIPTION OF THE DRAWINGS

The following description in conjunction with the accompanying drawings, the above and other aspects, features and advantages of the embodiments of the present disclosure will become more apparent from the accompanying drawings in which.

DETAILED DESCRIPTION OF PREFERRED EMBODIMENTS

Figure 1:
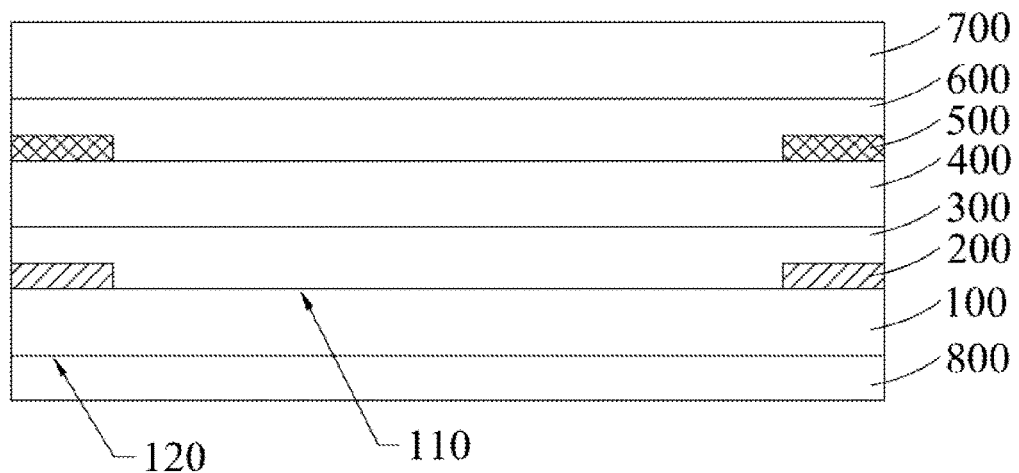
FIG. 1 is a structural schematic view of the touch display according to the first embodiment of the present disclosure.

Hereinafter, detailed embodiments will be described with reference to the accompanying drawings of the present disclosure. However, in many different forms and embodiments of the present disclosure, and the disclosure should not be construed as limited to the specific embodiments set forth herein. Rather, these embodiments are provided to explain the principles of the disclosure and its practical application, thereby others skilled in the art to understand the disclosure for various embodiments and various modifications suited to the particular intended application.

In the drawings, the thicknesses of the layers and regions are exaggerated for clarity of the device. In the drawings, the same reference numerals will be used throughout to designate the same elements.

It will be understood that, although the terms "first", "second", etc. may be used herein to describe various elements, these elements should not be limited by these terms. These terms are only used to distinguish one element from another separate.

FIG. 1 is a structural schematic view of the touch display according to the first embodiment of the present disclosure. The touch display according to the present disclosure can be used in an electronic device such as an intelligent wearable device such as a smart watch, a smart phone, a tablet computer or the like.

Refer to FIG. 1, the touch display according to the first embodiment of the present disclosure includes: a flexible substrate 100, a blocking layer 200, an insulating layer 300, a touch electrode thin film layer 400, a first wiring layer 500, a adhesive 600 and a display screen 700.

The flexible substrate 100 may be made of transparent and flexible polyethylene terephthalate (PET), polymethyl methacrylate (PMMA) or polycarbonate (PC), but the present disclosure is not limited thereto, for example, the flexible substrate 100 may be made of other materials having good transparency, flexibility, and optical properties. The flexible substrate 100 includes opposing first and second surfaces 110 and 120, wherein the first surface 110 is the functional surface of the flexible substrate 100 and the second surface 120 is the non-functional surface of the flexible substrate 100.

The blocking layer 200 is arranged on the first surface 110 and is located at the side end of the first surface 110. Here, the blocking layer 200 may be in an annular shape, which surrounds the lateral end of the first surface 110, but the present disclosure is not limited thereto. Preferably, the blocking layer 200 is made by printing a light impermeable ink of a predetermined thickness at the side end of the first surface 110, and forming the blocking layer 200 after the printed ink is cured.

The insulating layer 300 is arranged on the blocking layer 200 and the first surface 110. The blocking layer 200 and the first surface 110 are coated with the suitable thickness of the insulating material to form the insulating layer 300 after curing of the applied insulating material.

Figure 2:
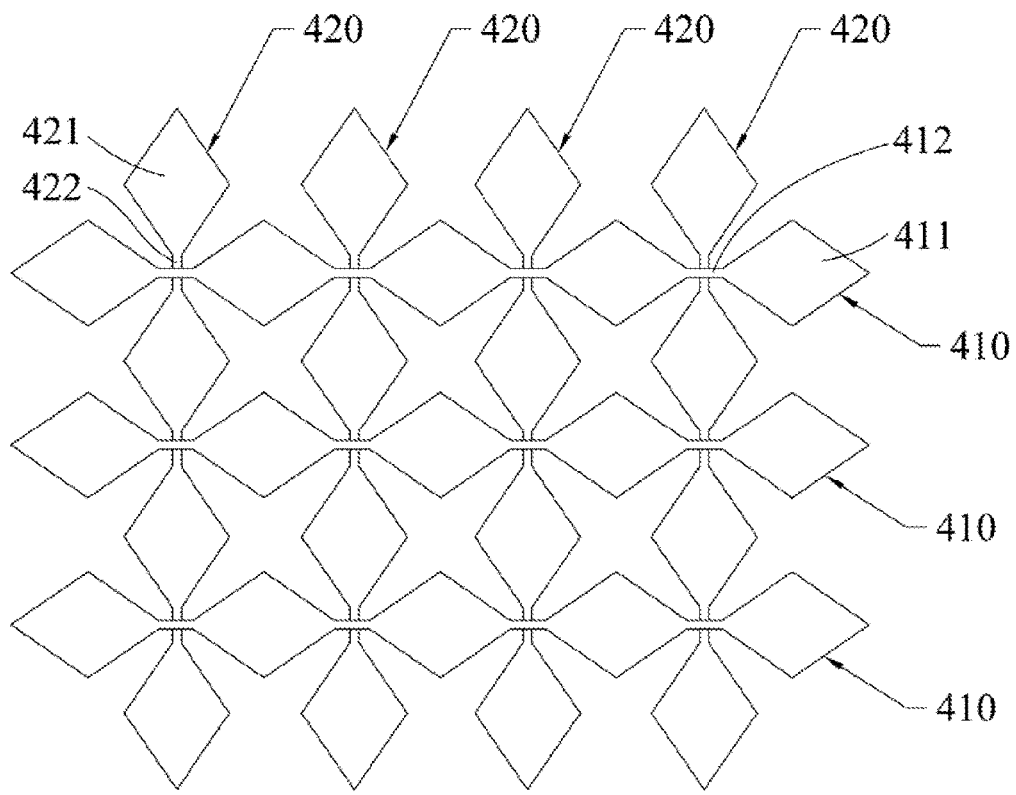
FIG. 2 is a structural schematic view of the touch electrode thin film layer according to the first embodiment of the present disclosure.

The touch electrode thin film layer 400 is arranged on the insulating layer 300. FIG. 2 is a structural schematic view of the touch electrode thin film layer according to the first embodiment of the present disclosure.

Refer to FIG. 2, the touch electrode thin film layer 400 according to the first embodiment of the present disclosure includes a plurality of first sensing strings 410 and a plurality of second sensing strings 420.

Each of the first sensing strings 410 extends in the row direction, and these first sensing strings 410 are parallel and separated from each other, in other words, the two adjacent first sensing strings 410 are parallel to each other in the column direction and do not mutually contact. Each first sensing strings 410 includes a plurality of first sensing pads 411 connected in series and a plurality of first bridge lines 412, each first bridge lines 412 disposed between two adjacent first sensing pads and connecting the two adjacent first sensing pads 411 in series with each other. It is to be noted that the present disclosure does not specifically limit the number of the first sensing line 410 and the first sensing pad 411 and the first bridge line 412 included in the first sensing line 410, and may be set according to actual needs.

Each of the second sensing strings 420 extends in the column direction, and these second sensing strings 420 are parallel and separated from each other, in other words, the two adjacent second sensing strings 420 are parallel to each other in the row direction and do not mutually contact. Each second sensing strings 420 includes a plurality of second sensing pads 421 connected in series and a plurality of second bridge lines 422, each second bridge lines 422 disposed between two adjacent first sensing pads and connecting the two adjacent second sensing pads 421 in series with each other. It is to be noted that the present disclosure does not specifically limit the number of the second sensing line 420 and the second sensing pad 421 and the second bridge line 422 included in the second sensing line 420, and may be set according to actual needs.

In the present embodiment, the first sensing pad 411 and the second sensing pad 421 are in the same layer, and the first sensing pad 411 and the second sensing pad 421 are separated from each other. In addition, the first bridge line 412 and the second bridge line 422 are insulated from each other, and for example, it may arranged an insulator at the overlap of the first bridge line 412 and the second bridge line 422.

In the present embodiment, the first sense string 410 serves as the emitter electrode (i.e., the Tx electrode), and the second sense string 420 serves as the receive electrode (i.e., the Rx electrode), but the present disclosure is not limited thereto. For example, the first sense string 410 may act as a receive electrode, and the second sense string 420 may be the emitter electrode.

In addition, although the shape of the first and second sensing pads 411 and 421 are both diamond-shaped in the present embodiment, the present disclosure is not limited to this, for example, the shape of the first sensing pad 411 and/or the second sensing pad 421 may also be trapezoidal, cross, triangular, regular hexagonal, regular pentagonal, or other suitable shape.

In the present embodiment, the first sensing string 410 and/or the second sensing string 420 are thin film electrodes made of one of carbon nanotubes, nanosilver wires, and silver nanoparticles, but the present disclosure is not limited thereto.

With continued reference to FIG. 1, the first wiring layer 500 is arranged on the touch electrode thin film layer 400 and is located at the side end of the touch electrode thin film layer 400. In the present embodiment, the first wiring layer 500 is respectively connected to the first sensing string 410 and the second sensing string 4201 to transmit electrical signals. The first wiring layer 500 is formed by printing a silver paste on the side ends of the touch electrode thin film layer 400, after curing, etching the cured silver film by laser or ion etching to form the first wiring layer 500.

The adhesive layer 600 is arranged on the touch electrode thin film layer 400 and the first wiring layer 500. In the present embodiment, the adhesive layer 600 may be made of, for example, a transparent optical adhesive, but the present disclosure is not limited thereto.

The display 700 is adhered to the adhesive layer 600. Specifically, the display surface of the display 700 (i.e., the surface toward the user's display) is adhered to the adhesive layer 600. In the present embodiment, the display 700 may be, for example, an active matrix organic light emitting diode display (AMOLED), or a liquid crystal display.

In order to protect the non-functional surface, that is, the second surface 120, of the flexible substrate 100, enhance the surface hardness and scratch resistance of the second surface 120, the touch display device according to the first embodiment of the present disclosure further includes a hard protective layer 800 arranged on the second surface 120 of the flexible substrate 100. The hard protective layer 800 may be made of a suitable hard material having sufficient hardness and scratch resistance while having a low roughness and a certain degree of anti-dirty and anti-fingerprint oil stain effect and the like.

Figure 3:
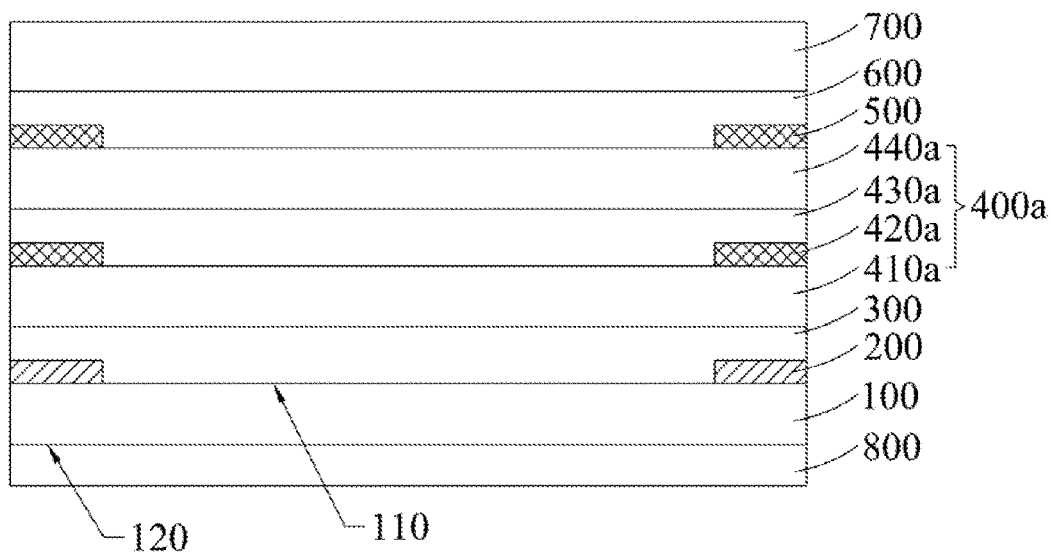
FIG. 3 is a structural schematic view of the touch display according to the second embodiment of the present disclosure.
Figure 4:
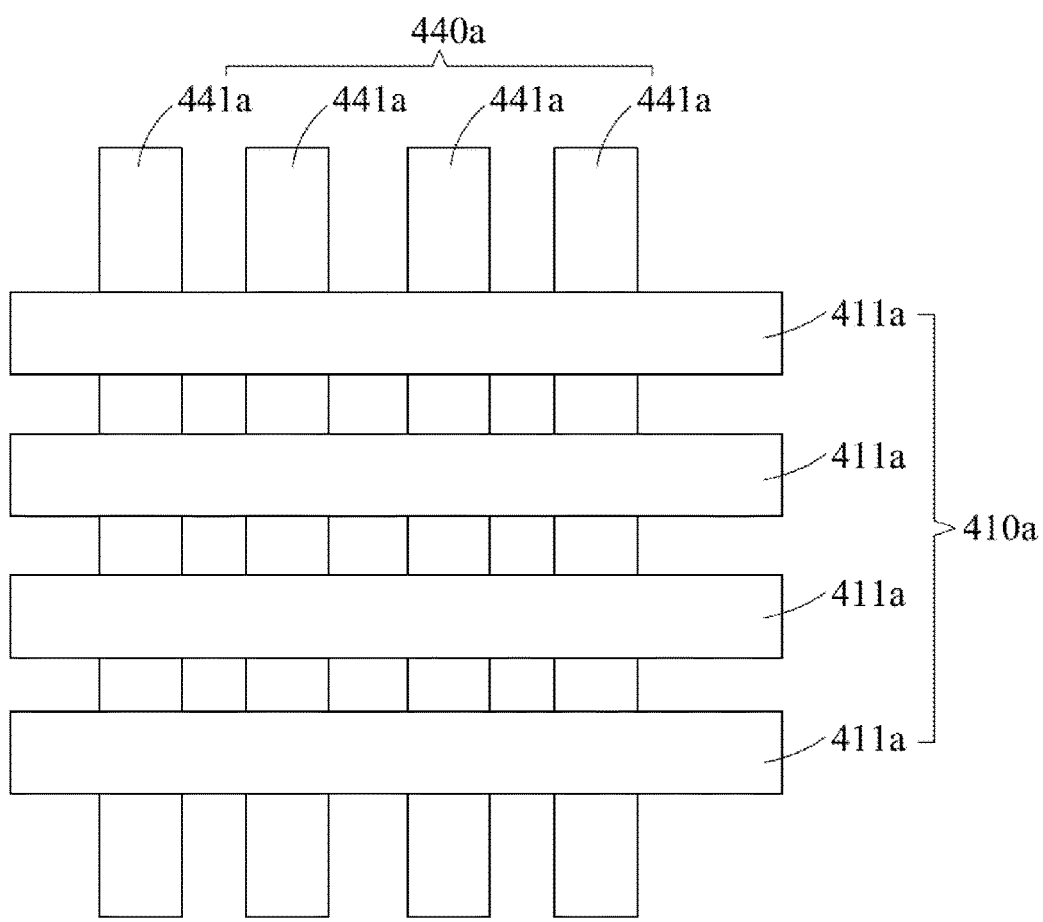
FIG. 4 is a schematic diagram of the first sensing layer and the second sensing layer spatially according to the present disclosure embodiment.

FIG. 3 is a structural schematic view of the touch display according to the second embodiment of the present disclosure. FIG. 4 is a schematic diagram of the first sensing layer and the second sensing layer spatially according to the present disclosure embodiment.

Refer to FIG. 3 and FIG. 4, the different from the structure of the touch display of the first embodiment of the present disclosure is: the touch electrode thin film layer 400a includes: a first sensing layer 410a, a second wiring layer 420a, insulation spacer layer 430a and a second sensing layer 440a.

The first sensing layer 410a is arranged on the insulating layer 300. The first sensing layer 410a includes a plurality of first sensing strips 411a, each of the first sensing strips 411a which extends in a row direction, and these first sensing strips 411a are parallel to and separate from each other, in other words, the two adjacent first sensing strips 411a are parallel to each other in the column direction and do not contact each other. It is to be noted that the present disclosure does not specifically limit the number of the first sensing strips 411a, and may be set according to actual needs. In this embodiment, the first sensing strip 411a has a rectangular shape. However, the present disclosure is not limited to this. For example, the first sensing strip 411a may have a structure in which the first sensing strip 410 is used. In the present embodiment, the first sensing strip 411a is a thin film electrode made of one of carbon nanotubes, nanosilver wires and nano-silver particles. However, the present disclosure is not limited to this.

The second wiring layer 420a is arranged on the first sensing layer 410a and on the side end of the first sensing layer 410a. In the present embodiment, the second wiring layer 420a is used for connection with the first sensing strip 411a to transmit electrical signals. The second wiring layer 420a is formed by printing a silver paste on the side end of the first sensing layer 410a, and after curing, etching the cured silver film by laser or ion etching to form a second wiring layer 420a.

The insulation spacer layer 430a is arranged on the first sensing layer 410a and the second wiring layer 420a. The first sensing layer 410a and the second wiring 420a are coated with the suitable thickness of the insulating material to form the insulation spacer layer 430a after curing of the applied insulating material.

The second sensing layer 440a is provided on the insulating spacer layer 430a. The second sensing layer 440a includes a plurality of second sensing strips 441a, each second sensing strips 441a extending in a column direction, and the second sensing strips 441a are parallel to and separate from each other, in other words, The two adjacent second sensing strips 441a are parallel to each other in the row direction and do not contact each other. It is to be noted that the present disclosure does not specifically limit the number of second sensing strips 441a, and may be provided in accordance with actual needs. In the present embodiment, the second sensing strip 441a has a rectangular shape, but the present disclosure is not limited thereto. For example, the second sensing strip 441a may have a configuration in which the second sensing strip 420 is used. In the present embodiment, the second sensing strip 441a is a thin film electrode made of one of carbon nanotube, nanosilver, and silver nanoparticles, but the present disclosure is not limited thereto.

The first wiring layer 500 is arranged on the touch electrode thin film layer 400 and is located at the side end of the second sense layer 440a. In the present embodiment, the first wiring layer 500 is used for connection with the second sensing layer 440a to transfer electrical signals.

The adhesive layer 600 is arranged on the second sensing layer 440a and the first wiring layer 500. In this embodiment, the adhesive layer 600 may be made of, for example, a transparent optical adhesive, but the present disclosure is not limited thereto.

In summary, according to the touch display device of the embodiment of the present disclosure, a touch function is implemented using a thin film so as to have a thinner thickness and enable free bending.

Although reference to particular embodiments shown and described the present disclosure, those skilled in the art will understand: without departing from the spirit and scope of the appended claims and their equivalents of the present disclosure, a case, in this that various changes in form and details.

What is claimed is:

1. A touch display comprising:
   a substrate having opposite first and second surfaces;
   a blocking layer arranged on the first surface and at a side end of the first surface, wherein the blocking layer is formed by printing a light impermeable ink of a predetermined thickness;
   an insulating layer arranged on the first surface and the blocking layer;
   a touch electrode thin film layer arranged on the insulating layer;
   a first wiring layer arranged on the touch electrode thin film layer, wherein the first wiring layer is formed by printing a silver paste on the side ends of the touch electrode thin film layer;
   an adhesive layer arranged on the touch electrode film layer and the first wiring layer;
   and a display screen adhered on the adhesive layer,
   wherein a part of the first wiring layer covers the touch electrode layer, and the part of the first wiring layer covering the touch electrode layer is covered by the adhesive layer;
   wherein the touch electrode thin film layer comprises a plurality of first sensing patterns extending in a row direction and a plurality of second sensing patterns extending in a column direction; and
   wherein the first sensing patterns and/or the second sensing patterns are selected from one of carbon nanotubes, nanosilver lines and nano-silver particles.

2. The touch display according to claim 1, wherein, the touch display further comprises: a hard protective layer arranged on the second surface.

3. The touch display according to claim 1, wherein,
   the plurality of first sensing patterns is a plurality of first sensing strings extending in a row direction and the plurality of first sensing strings parallel to and separate from each other, each first sensing string comprising a plurality of first sensing pads in series and a plurality of first bridge lines, each first bridge line disposed between two adjacent first sensing pads and connecting the two adjacent first sensing pads in series with each other;

the plurality of second sensing patterns is a plurality of second sensing strings extending in a column direction and the plurality of second sensing strings parallel to and separate from each other, each second sensing string comprising a plurality of second sensing pads in series and a plurality of second bridge lines, each second bridge line disposed between two adjacent second sensing pads and connecting the two adjacent second sensing pads in series with each other;

the first sensing pad and the second sensing pad are located in the same layer, the first and second bridge wires are insulated from each other.

4. The touch display according to claim 2, wherein, the plurality of first sensing patterns is a plurality of first sensing strings extending in a row direction and the plurality of first sensing strings parallel to and separate from each other, each first sensing string comprising a plurality of first sensing pads in series and a plurality of first bridge lines, each first bridge line disposed between two adjacent first sensing pads and connecting the two adjacent first sensing pads in series with each other;

the plurality of second sensing patterns is a plurality of second sensing strings extending in a column direction and the plurality of second sensing strings parallel to and separate from each other, each second sensing string comprising a plurality of second sensing pads in series and a plurality of second bridge lines, each second bridge line disposed between two adjacent second sensing pads and connecting the two adjacent second sensing pads in series with each other;

the first sensing pad and the second sensing pad are located in the same layer, the first and second bridge wires are insulated from each other.

5. The touch display according to claim 1, wherein, the plurality of first sensing patterns is a plurality of first sensing strips;

the plurality of second sensing patterns is a plurality of second sensing strips;

the touch electrode thin film layer comprises:

a first sensing layer arranged on the insulating layer, the first sensing layer comprises the plurality of first sensing strips, each first sensing strip extends in a row direction and the plurality of first sensing strips are parallel to each other and separated from each other;

a second wiring layer arranged on the first sensing layer and at a side end of the first sensing layer;

an insulation spacer layer arranged on the first sensing layer and the second wiring layer;

a second sensing layer arranged on the insulation spacer layer, the second sensing layer comprises a plurality of second sensing strips, each second sensing strip extends in a column direction and the plurality of second sensing strips are parallel to each other and separated from each other;

wherein, the first wiring layer is provided on the second sensing layer and is located at a side end of the second sensing layer, the adhesive layer is arranged on the second sensing layer and the first wiring layer.

6. The touch display according to claim 2, wherein, the plurality of first sensing patterns is a plurality of first sensing strips;

the plurality of second sensing patterns is a plurality of second sensing strips;

the touch electrode thin film layer comprises:

a first sensing layer arranged on the insulating layer, the first sensing layer comprises the plurality of first sensing strips, each first sensing strip extends in a row direction and the plurality of first sensing strips are parallel to each other and separated from each other;

a second wiring layer arranged on the first sensing layer and at a side end of the first sensing layer;

an insulation spacer layer arranged on the first sensing layer and the second wiring layer;

a second sensing layer arranged on the insulation spacer layer, the second sensing layer comprises a plurality of second sensing strips, each second sensing strip extends in a column direction and the plurality of second sensing strips are parallel to each other and separated from each other;

wherein, the first wiring layer is provided on the second sensing layer and is located at a side end of the second sensing layer, the adhesive layer is arranged on the second sensing layer and the first wiring layer.

7. The touch display according to claim 1, wherein, the display is an organic electroluminescent display.

8. The touch display according to claim 2, wherein, the display is an organic electroluminescent display.

9. The touch display according to claim 1, wherein, the adhesive layer is made of optical glue.

10. The touch display according to claim 2, wherein, the adhesive layer is made of optical glue.

11. An electronic device comprising the touch display device according to claim 1.

* * * * *